United States Patent [19]
Arimune et al.

[11] Patent Number: 5,232,790
[45] Date of Patent: Aug. 3, 1993

[54] MAGNETO-OPTICAL RECORDING DISC AND METHOD OF PRODUCING IT

[75] Inventors: Hisao Arimune, Gamou; Mituo Miyazaki, Ohmihachiman; Hiroki Tanaka, Yohkaichi, all of Japan

[73] Assignee: Kyocera Corporation, Kyoto, Japan

[21] Appl. No.: 691,134

[22] Filed: Apr. 25, 1991

[30] Foreign Application Priority Data

Apr. 28, 1990 [JP] Japan .................. 2-114059

[51] Int. Cl.⁵ .................. G11B 5/66; C23C 14/00
[52] U.S. Cl. .................. 428/694; 204/192.15; 204/192.16; 204/192.20; 204/192.26; 360/131; 360/135; 369/13; 428/698; 428/702; 428/704; 428/900; 430/945
[58] Field of Search ............... 428/694, 900, 698, 699, 428/702, 704; 204/192.15, 192.16, 192.20, 192.26; 369/13, 14; 430/945; 360/131, 135

[56] References Cited

U.S. PATENT DOCUMENTS

| | | | |
|---|---|---|---|
| 3,463,574 | 8/1969 | Bastien | 350/164 |
| 4,639,816 | 1/1987 | Tomita | 360/131 |
| 4,649,451 | 3/1987 | Tomita | 360/131 |
| 4,664,977 | 5/1987 | Osato et al. | 428/336 |
| 4,680,742 | 7/1987 | Yamada et al. | 369/13 |

FOREIGN PATENT DOCUMENTS

| | | |
|---|---|---|
| 57-169996 | 10/1982 | Japan . |
| 56242 | 3/1984 | Japan . |
| 59-121368 | 7/1984 | Japan . |
| 59-171054 | 9/1984 | Japan . |
| 59-171055 | 9/1984 | Japan . |
| 227053 | 12/1984 | Japan . |
| 61-258351 | 11/1986 | Japan . |
| 61-258353 | 11/1986 | Japan . |
| 62-172545 | 7/1987 | Japan . |
| 63-81643 | 4/1988 | Japan . |
| 63-195846 | 8/1988 | Japan . |
| 2143689 | 2/1985 | United Kingdom . |

Primary Examiner—Paul J. Thibodeau
Assistant Examiner—R. Follett
Attorney, Agent, or Firm—Spensley Horn Jubas & Lubitz

[57] ABSTRACT

The refractive index of a dielectric layer between a transparent substrate and a magneto-optical recording layer is varied across the thickness, with a portion of the layer on the substrate side having a lower refractive index and the other portion on the magneto-optical recording layer side having a higher refractive index, to prevent the disc from warping. To increase the refractive index within the the dielectric layer, the argon pressure is lowered in the course of the sputtering. Alternatively, an interruption of the sputtering can reduce warpage.

18 Claims, 2 Drawing Sheets

MAGNETO-OPTICAL RECORDING DISC AND METHOD OF PRODUCING IT

FIELD OF INDUSTRIAL APPLICATION

The present invention relates to a magneto-optical recording disc wherein at least one dielectric layer and a magneto-optical recording layer are stacked together on a transparent substrate and to a method of producing said disc. The present invention particularly relates to a magneto-optical recording disc of which disc warping is reduced without virtually reducing the carrier-to-noise ratio (CN ratio) and a method of producing said disc. The present invention particularly relates improvements of dielectric layers of a magneto-optical recording disc.

BACKGROUND OF THE INVENTION

Magneto-optical recording discs wherein a dielectric layer and a magneto-optical recording layer are stacked on a transparent substrate are attracting much attention as large-capacity recording devices. Writing on these recording discs is effected by applying a magnetic field to the disc being locally heated by a laser beam to magnetize the disc in the desired direction. Reading of the recording disc is effected by irradiating the disc with a polarized laser beam to use Kerr effect or Faraday effect of the reflected light.

In these magneto-optical recording discs a dielectric layer is provided between the transparent substrate and the magneto-optical recording layer to enhance the magneto-optic effect. Materials normally used for the dielectric layer include oxides such as amorphous-yttrium-sialon (YSiAlON), $SiO_2$, $SiO$, $CeO_2$, $ZrO_2$, $TiO_2$, $Bi_2O_3$; sulfides such as $ZnS$ and $Sb_2S_3$; and nitrides such as $Si_3N_4$ and $NbSiN$. For instance, the U.S. Pat. No. 4,680,742 and the Japanese Provisional Patent Publication No. SHO-63-195,846 disclose a dielectric layer of amorphous-yttrium siaion. The Japanese Provisional Patent Publication No. SHO-57-169,996 discloses a dielectric layer of SiO. Further, the Japanese Provisional Patent Publication Nos. SHO-59-121,368, SHO-59-171,054 and SHO-62-172,545 disclose a dielectric layer of $Si_3N_4$. Moreover, the Japanese Provisional Patent Publication No. SHO-59-171,055 discloses a dielectric layer of AlN. The Japanese Provisional Patent Publication No. SHO-61-258,353 discloses a dielectric layer of amorphous $SiN_x$, and the Japanese Provisional Patent Publication No. SHO-63-81,643 discloses a dielectric layer of NbSiN.

There is a problem. The substrate tends to warp after production since there is a large internal stress in the dielectric layer. When the substrate warps, it will become hard to track or focus on the magneto-electrical recording disc. The internal stress in the dielectric layer is related to the optical constants and the CN ratio of the magneto-optical recording disc, and can not be selected from the viewpoint of reduction in the angle of warpage alone. The film thickness of the dielectric layer has an optimal value for attaining the enhancement effect, and, therefore, can not be selected freely.

BRIEF DESCRIPTION OF THE INVENTION

The objective of the present invention is to control the disc warpage due to the dielectric layer without virtually lowering the CN ratio so as to facilitate focusing and tracking.

Another objective of the present invention is to develop a method for producing a magneto-optical recording disc that meets the above-mentioned objective.

According to the present invention, the refractive index of the dielectric layer is varied across the layer. A portion of the layer on the transparent substrate side has a lower refractive index, and the other portion on the magneto-optical recording layer side has a higher refractive index. In an embodiment of the present invention, the dielectric layer is divided into two sublayers; the sublayer on the substrate side has a lower refractive index, and the sublayer on the magneto-optical recording layer side has a higher refractive index. However, this is not a limitation. The dielectric layer may be divided into three or four sublayers, their respective refractive indexes increasing gradually from the sublayer on the substrate side towards the sublayer on the recording layer side. Furthermore, the refractive index may be increased continuously and smoothly from the substrate side towards the recording layer side.

When a dielectric layer is formed by sputtering, the refractive index of the layer is related to the sputtering pressure. The greater is the sputtering pressure, the lower is the refractive index of the layer. The lower is the sputtering pressure, the greater is the refractive index of the layer. Hence the refractive index of the dielectric layer may be varied across the layer by altering the sputtering pressure during the course of sputtering.

The refractive index and the internal stress of a dielectric layer have a close relationship with each other. For the same material, the higher the refractive index, the greater the internal stress; and the lower the refractive index, the smaller the internal stress. Warpage of a disc may be controlled by varying the refractive index of the dielectric layer across the layer, with a lower index on the transparent substrate side and a higher index on the magneto-optical recording layer side, to reduce the overall internal stress. A drop in the CN ratio accompanying this variation in the refractive index is small; warpage of the disc may be controlled without lowering the CN ratio.

Another method for effectively controlling warpage of the disc is to interrupt sputtering once in the course of sputtering the dielectric layer. For instance, if sputtering is divided into two parts, and the sputtering is interrupted in the middle for about 20 to 30 seconds, the warpage of the disc will be reduced significantly. The cooling effect of the substrate can be neglected for such a duration. Hence this is not a thermal phenomenon. Such a simple method, however, is capable of controlling the disc from warping. A drop in the CN ratio due to the interruption of sputtering is negligible.

DETAILED DESCRIPTION OF THE INVENTION

Figure 1:
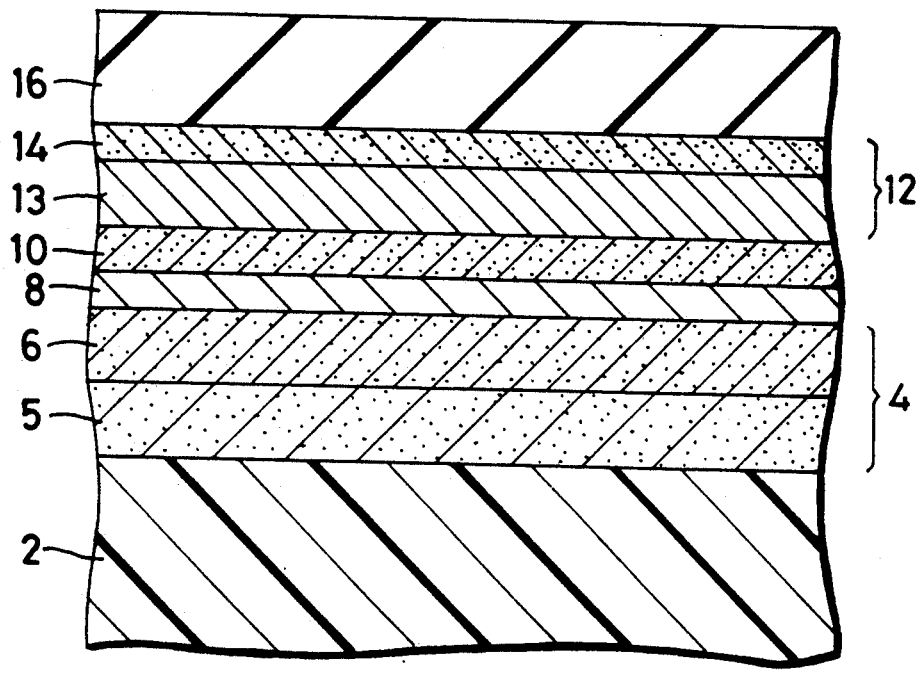
FIG. 1 is a cross sectional view showing a magneto-optical recording disc of the embodiment.

The magneto-optical recording disc of the embodiment is shown in FIG. 1. In the diagram, 2 denotes a disc-shaped transparent substrate (130 mm in diameter) made of polycarbonate resin. The substrate may be substituted with any transparent substrate made of materials such as glass, epoxy resin, polyester resin, acrylic resin, or amorphous polyolefin resin.

4 denotes a dielectric layer. The present invention relates to control of warpage caused by the dielectric layer 4. The dielectric layer 4 comprises a first dielectric sublayer 5 on the transparent substrate side and a second dielectric layer 6 on the magneto-optical recording layer side. The first and second dielectric layers 5, 6 are made of amorphous-yttrium-sialon; for convenience of production, both layers are made of the same material. The dielectric layer 5 on the transparent substrate side has a lower refractive index and a smaller internal stress than the dielectric layer 6 on the magneto-optical recording layer side. The total thickness of the dielectric layers 5 and 6 is determined to maximize Kerr enhancement effect according to the prior art. The dielectric layers 5 and 6 are made of the common material. In addition to amorphous-yttrium-sialon indicated in the embodiment, materials such as $SiO_2$, $SiO$, $CeO_2$, $ZrO_2$, $TiO_2$, $Bi_2O_3$, $ZnS$, $Sb_2S_3$, and $Si_3N_4$ may be used.

8 denotes the magneto-optical recording layer for which an amorphous thin layer having a magnetizing direction perpendicular to the substrate 2 is used. Materials for such a thin film include GdDyFe, GdTbFe, TbFeCo, DyFeCo, GdTbDyFe, GdTbFeCo, TbDyFeCo, GdDyFeCo, NdGdDyFe, NdDyFeCo, and NdGdDyFeCo.

10 is an upper dielectric layer. It may be omitted. The material is similar to those of the dielectric layers 5 and 6. 12 is a reflective layer. In the present embodiment, it comprises two layers; a metallic reflective layer 13 and an amorphous protective layer 14. The reflective layer 12 reflects incident laser light coming from the substrate side, enabling reading due to Kerr effect. The layer 12 also shields and protects the magneto-optical recording layer 8 from oxygen, moisture, etc. The metallic reflective layer 13 is mainly used for reflecting the laser light while the amorphous protective layer 14 is mainly used for shielding the metallic reflective layer 13 and the magneto-optical recording layer 8 from oxygen, moisture, etc. to improve the durability of the magneto-optical recording disc.

Materials for the metallic reflective layer 13 include, for example, aluminium which is inexpensive and has a high reflectivity, and titanium which has an excellent corrosion resistance. Materials for the amorphous protective layer 14, include, for example, lower oxides of metals such as Al, Ti, Cr and Cu, and preferable materials are lower oxides of Al or Ti. For convenience of production, it is desirable to use the same metallic component for both the metallic reflective layer 13 and the amorphous protective layer 14. According to some experiments conducted by the present inventors, the corrosion resistance of magneto-optical recording discs were significantly improved by the provision of the amorphous protective layer 14.

16 denotes a resin layer for which, for example, ultraviolet-photo-cure resins of acrylate resin, epoxy resin, polyester resin, acrylic resin, and acrylic-urethane may be used. The resin layer 16 may be omitted.

Examples of production of magneto-optical recording discs and the results of performance tests on the discs are shown below. Polycarbonate resin discs having a diameter of 130 mm (the central bore diameter: 30 mm) were used as the substrate 2. Pretreatments comprising heating and deaeration under the vacuum and ion bombardment were given to the substrate 2. Then in an atmosphere of argon, the dielectric layer 4 through the reflective layer 12 were formed by magnetron sputtering to produce magneto-optical recording discs. The attained vacuum was $5 \times 10^{-7}$ Torr, and the distance between the substrate 2 and the target was 120 mm. The sputtering power was 1 kW.

The target was a sintered of $Si_3N_4$, $Al_2O_3$ and $Y_2O_3$ having a mol ratio of 86:10:4 in this order. The dielectric layers 5 and 6 were formed of amorphous-yttrium-sialon. First, sputtering was made with argon pressure of 5 to 4 mTorr to form the first dielectric layer 5 of 49 nm thick, having a low refractive index and a small internal stress. Next, the RF power was cut off to extinguish the plasma and interrupt sputtering for 20 to 30 seconds. After that, sputtering was resumed, and with the same target, the argon pressure was reduced to 3 mTorr to form the second dielectric layer 6 of the same thickness of 49 nm, having a higher refractive index and a greater internal stress (specimens 1 and 2).

To test the effect of interrupting sputtering, the plasma was extinguished halfway once for about 20 to 30 seconds, with the sputtering pressure being fixed at 3 mTorr; thus the dielectric layer 4 was formed in two steps (specimen 3).

A specimen was prepared by reversing the order of the argon pressures for the specimens 1 and 2 while other conditions were kept identical; thus the first dielectric layer 5 was sputtered at 3 mTorr, and the second dielectric layer 6 at 5 mTorr (specimen 4). In addition to those mentioned above, a control was prepared by sputtering a dielectric layer 4, with argon pressure at 3 mTorr, without any interruption of sputtering (specimen 5). For any of the specimens 1 through 4, replacement of a target was not made in the course of sputtering.

After formation of the dielectric layers 5 and 6, a magneto-optical recording layer 8 comprising a vertically magnetized film of amorphous GdDyFe was formed to 20 nm thick by using a target of GdDyFe. Further, with argon pressure of 3 mTorr, an upper dielectric layer 10 of amorphous-yttrium-sialon was formed to 30 nm thick, and on top of said layer, a reflective layer 12 was stacked by using a composite target of aluminium and carbon chip. The lower metallic reflective layer 13 was sputtered to 80 nm thick in an atmosphere of pure argon, and the upper amorphous protective layer 14 was sputtered to 15 nm thick in an atmosphere of argon to which oxygen was introduced.

After completion of the sputtering, an UV-photocure resin of copolymer of urethane acrylate and acrylic ester was spin-coated and cured with UV light to form a resin layer of 10 μm thick.

Figure 2:
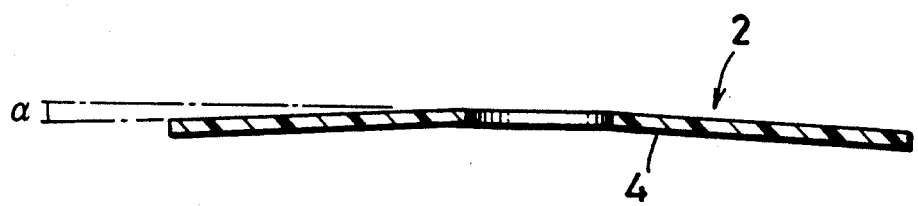
FIG. 2 is a cross sectional view illustrating the meaning of an angle of warpage of a magneto-optical recording disc.
Figure 3:
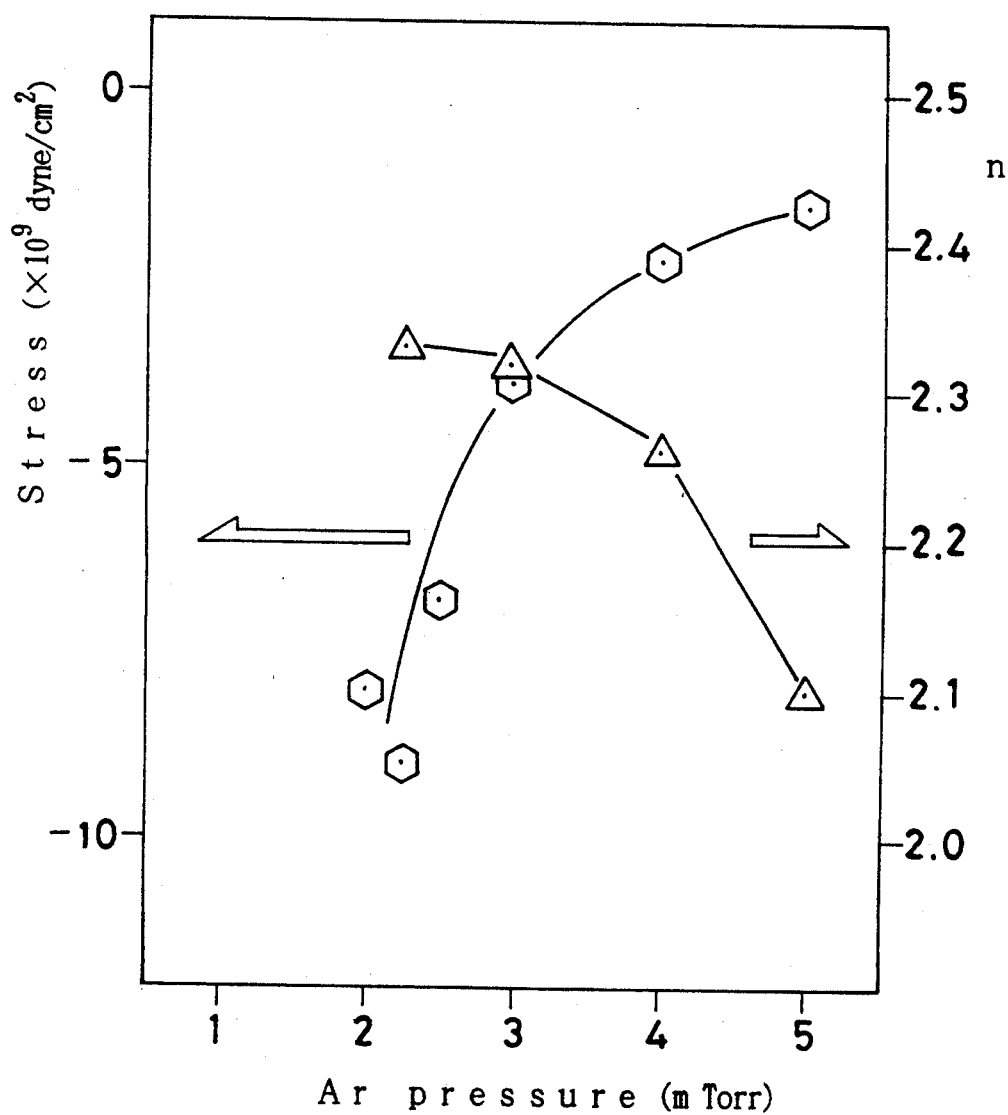
FIG. 3 is a diagram showing the relationship between the argon pressure and the refractive index and the internal stress of the dielectric layer.

The magneto-optical recording discs thus produced were measured in terms of angle of warpage, refractive index, CN ratio, etc. The angle of warpage was measured as the angle α of FIG. 2. FIG. 3 shows the relationships between the argon pressure during sputtering and the refractive index n, and between the argon pressure and the compressive stress for the case wherein the dielectric layer 4 was a single layer of 98 nm thick, without any differentiation between a first dielectric layer 5 and a second dielectric layer 6. The more the argon pressure was increased, the more the refractive index and the compressive stress were reduced.

Table 1 shows the results of performance tests. The second dielectric layers 6 were formed with a sputtering pressure of 3 mTorr. This value was the optimal pressure when the dielectric layer 4 was formed as a single layer. The CN ratio and the refractive index were measured for a laser light of which wavelength was 800 nm.

TABLE 1

| | Performance tests | | | | |
|---|---|---|---|---|---|
| | Film forming conditions | | | Angle of | CN |
| No. | Lower portion | Upper portion | Refraction index | warpage (mRad) | ratio (dB) |
| 1 | 5 mTorr / 49 nm | 3 mTorr / 49 nm | 2.10/2.32 | 0.80 | 48.5 |
| 2 | 4 mTorr / 49 nm | 3 mTorr / 49 nm | 2.26/2.32 | 1.24 | 48.6 |
| 3 | 3 mTorr / 49 nm | 3 mTorr / 49 nm | 2.32/2.32 | 1.68 | 48.8 |
| 4* | 3 mTorr / 49 nm | 5 mTorr / 49 nm | 2.32/2.10 | 1.18 | 47.9 |
| 5* | 3 mTorr 98 nm | | 2.32 | 3.0 | 48.8 |

*Mark * indicates a control.
Regarding the film making conditions, the lower portion indicates the first dielectric layer 5, and the upper portion the seocnd dielectric layer 6.

As clearly shown in Table 1, the angle of warpage can be reduced, while the CN ratio is kept unchanged, by making the refractive index of the first dielectric layer 5 smaller and making the refractive index of the second dielectric layer 6 larger. In these cases, sputtering was interrupted during the formation of the films of the first dielectric layer 5 and the second dielectric layer 6. Formation of the films, however, may be made continuously by altering the sputtering pressure rather than interrupting sputtering. In the case of the specimen 2, the difference between the refractive index $n_2$ of the second dielectric layer and the refractive index $n_1$ of the first dielectric layer was 0.06, and the angle of warpage was reduced by about 60%. The difference between the refractive index near the magneto-optical recording layer 8 and the refractive index near the transparent substrate 2 should be preferably not less than 0.02, more preferably not less than 0.04, and much more preferably not less than 0.06. The upper limit of the difference between the refractive indexes is practically set at 0.40 since it is hard to achieve a larger difference than the value. Regarding the refractive indexes, the refractive index $n_1$ of the first dielectric layer 5 and the refractive index $n_2$ of the second dielectric layer 6 should be, for example, $2.00 < n_1 < 2.30$ and
$2.30 < n_2 < 2.40$ In the case of the specimen 3, wherein the formation of the dielectric layers 5 and 6 was made in two parts by interposing an interruption of sputtering for about 20 to 30 seconds, with two parts of sputtering made at the same 3 mTorr, the angle of warpage was 1.68 mRad; it was about one half of that of the control or specimen 5. Methods for interrupting sputtering may include lowering the RF power, and shifting the argon pressure out of the plasma-generating range. It is sufficient to extinguish the plasma to interrupt sputtering. The duration of the interruption of sputtering should be, for example, not less than one second, and preferably not less than 10 seconds. The upper limit of the duration of the interruption should be, for example, 10 minutes from the viewpoint of efficiency of film formation.

In the case of the embodiment 1, wherein the first dielectric layer 5 was sputtered at 5 mTorr, and the second dielectric layer 6 was sputtered at 3 mTorr, the angle of warpage was as small as 0.80 mRad, and the drop in the CN ratio was 0.3 dB. In the case of the embodiment 2, wherein the first dielectric layer 5 was formed at 4 mTorr, and the second dielectric layer 6 was formed at 3 mTorr, the angle of warpage was 1.24 mRad, and the drop in the CN ratio was 0.2 dB. When the sputtering pressure was reduced by 1 mTorr in the course of sputtering, the angle of warpage was reduced significantly. Hence the preferable intermediate reduction in the sputtering pressure was set at 0.5 mTorr and over. This corresponds to reducing halfway the sputtering pressure by at least one eighth of the initial sputtering pressure.

In the case of the control or specimen 4, wherein the order of sputtering pressures of the embodiment 1 was reversed, thus the first dielectric layer 5 was formed at 3 mTorr and the second dielectric layer 6 was formed at 5 mTorr, the angle of warpage was as small as 1.18 mRad. The drop in the CN ratio, however, was as large as 0.9 dB. This indicates the need of making the refractive index on the magneto-optical recording layer 8 side higher and the refractive index on the transparent substrate 3 side lower.

The extinction coefficients (wavelength: 800 nm) of the specimens 1 through 5 were all as small as 0.05 or under, and adverse effects of light absorption on the CN ratio were negligible.

We claim:

1. A magneto-optical recording disc, wherein a dielectric layer is stacked on a transparent substrate and a magneto-optical recording layer is stacked on said dielectric layer, said disc being characterized in that the refractive index of said dielectric layer is differentiated across the thickness thereof so that the refractive index on the transparent substrate side is relatively lower and the refractive index on the magneto-optical recording layer side is relatively higher to each other, and wherein the dielectric layer is comprised of the same material from the transparent substrate side to the magneto-optical recording layer side.

2. A magneto-optical recording disc as described in claim 1, wherein the dielectric layer is formed of amorphous-YSiAlON.

3. A magneto-optical recording disc as described in claim 1 wherein the dielectric layer is formed of amorphous-yttrium-sialon.

4. A magneto-optical recording disc as described in claim 1 wherein said disc has an angle of warpage ranging from 0.80 to 1.24 mRad.

5. A magneto-optical recording disc as described in claim 1 wherein the dielectric layer is divided into 3 to 4 sublayers.

6. A magneto-optical recording disc as described in claim 5 wherein the refractive indexes of the sublayers increase gradually from the sublayer on the substrate side towards the sublayer on the recording layer side.

7. A magneto-optical recording disc comprising:
   a substrate;
   a first dielectric layer stacked on the substrate;
   a magneto-optical recording layer being stacked on the first dielectric layer;
   a second dielectric layer being formed on top of the magneto-optical recording layer;
   the first and second dielectronic layers comprising the same material;
   a reflective layer being stacked on the second dielectric layer;

an amorphous protective layer being stacked on the reflective layer; and the in that the refractive index of the first dielectric layer is differentiated across the thickness thereof so that the refractive index on the transparent substrate side is relatively lower and the refractive index on the magneto-optical recording layer side is relatively higher to each other.

8. A magneto-optical recording disc as described in claim 7 wherein the first and second dielectric layers are formed of amorphous-YSiAlON.

9. A magneto-optical recording disc as described in claim 7 wherein the first dielectric layer is divided into sublayers wherein the refractive indexes of the sublayers increase gradually from the sublayer on the substrate side towards the sublayer on the recording layer side.

10. A magneto-optical recording disc as described in claim 7 wherein the reflective layer includes a metallic reflective layer formed on top of the second dielectrical layer, and an amorphous protective layer stacked on the metallic reflective layer.

11. A magneto-optical recording disc as described in claim 7 wherein the metallic reflective layer is made of a material selected from the group consisting of aluminum, titanium and mixtures thereof.

12. A magneto-optical recording disc as described in claim 7 wherein the amorphous protective layer is made of a material selected from the group consisting of lower oxides of aluminum, titanium, chromium, copper and mixtures thereof.

13. A magneto-optical recording disc as described in claim 7 wherein the disc has an angle of warpage ranging from 0.80 to 1.24 mRad.

14. A method for producing a magneto-optical recording disc, wherein a dielectric layer and a magneto-optical recording layer are stacked on a transparent substrate by sputtering, wherein, in the course of sputtering the dielectric layer, the sputtering pressure is lowered to make the refractive index on the transparent substrate side relatively lower and the refractive index on the magneto-optical recording layer side relatively higher to each other, and the magneto-optical recording layer is stacked subsequently.

15. A method for producing a magneto-optical recording disc as described in claim 14, wherein, in the course of sputtering the dielectric layer, the sputtering pressure is reduced by at least one eighths of the initial value.

16. A method for producing a magneto-optical recording disc as described in claim 14, wherein a target is used in sputtering the dielectric layer and in the course of sputtering the sputtering pressure is reduced while the same target is used.

17. A method for producing a magneto-optical recording disc as described in claim 14, wherein in the course of reducing the sputtering pressure a step of interrupting the sputtering is provided.

18. A method for producing a magneto-optical recording disc, wherein a dielectric layer and a magneto-optical recording layer are stacked on a transparent substrate by sputtering, wherein in the course of reducing the sputtering pressure a step of interrupting the sputtering is provided.

* * * * *